United States Patent [19]

Grupp et al.

[11] Patent Number: 4,968,930
[45] Date of Patent: Nov. 6, 1990

[54] DISPLAY DEVICE FOR MEASURING INSTRUMENTS

[75] Inventors: Joachim Grupp, Peseux; Yves Ruedin, St-Blaise; Fridolin Wiget, Neuchâtel; Jean-Pierre Häring, Chézard, all of Switzerland

[73] Assignee: Asulab S.A., Bienne, Switzerland

[21] Appl. No.: 315,669

[22] Filed: Jan. 27, 1989

[30] Foreign Application Priority Data

Feb. 29, 1988 [FR] France ................. 88 02591

[51] Int. Cl.⁵ .................. G01R 13/00; G01R 13/10
[52] U.S. Cl. ........................ 324/115; 340/716; 340/784
[58] Field of Search ............. 324/115; 340/753, 754, 340/765, 716, 784; 350/331, 332, 336, 349

[56] References Cited

U.S. PATENT DOCUMENTS

| | | | |
|---|---|---|---|
| 3,689,835 | 9/1972 | Bickfrod | 324/115 |
| 3,833,287 | 9/1974 | Taylor et al. | 350/349 |
| 3,987,617 | 10/1976 | Slob | 340/753 |
| 4,174,500 | 11/1979 | Kuga | 324/115 |
| 4,254,375 | 3/1981 | Matsuoka | 324/115 |
| 4,281,903 | 8/1981 | Gharadjedaghi | 350/350 R |
| 4,314,146 | 2/1982 | Berney | 235/92 |
| 4,361,790 | 11/1982 | Laesser et al. | 310/40 R |
| 4,376,934 | 3/1983 | Prohaska et al. | 340/815.17 |

FOREIGN PATENT DOCUMENTS 3028593 2/1981 Fed. Rep. of Germany.

Primary Examiner—Reinhard J. Eisenzopf
Assistant Examiner—William J. Burns
Attorney, Agent, or Firm—Griffin Branigan & Butler

[57] ABSTRACT

A device for displaying the value of a quantity represented by input data comprises a mobile indicator member (24) driven by a stepping motor (20), a control circuit (18) for this motor for delivering drive pulses to the motor in response to the input data to move the indicator member to a position corresponding to the value of the quantity, and a dial (26) for showing an indexing system, for example a scale, which cooperates with the indicator member to indicate the value at least approximately. The dial comprises a liquid crystal, electrochromic or electroluminescent electrooptical display device (26) which displays the indexing system in response to signals from another control circuit (28) when the latter receives an activation signal. The device enables values of a single quantity situated in different ranges or values of distinct quantities to be indicated, by making the cell selectively display corresponding indexing systems. A specific application of the device is for automobile dashboards.

13 Claims, 6 Drawing Sheets

DISPLAY DEVICE FOR MEASURING INSTRUMENTS

The present invention concerns display devices for measuring instruments.

There are two known types of display device for measuring instruments, namely analog display devices and digital display devices.

Generally speaking, analog display devices are not as precise as digital display devices but they do have one particular advantage over them, namely they enable a rapid evaluation of the displayed quantity and, if this quantity is not constant, they facilitate observation of how the variations take place.

For some applications, this is important.

This is for example the case for display devices designed to form part of a supervision post for an installation such as an electricity generating station which has a large number of display devices. Analog display devices provide a good overall view which allows a rapid determination whether the installation is operating correctly or whether and where there is an anomaly.

The same applies for automobile vehicle dashboards where there are not so many display devices but where the driver must be able to know the approximate speed, the number of revolutions per minute of the engine, how much fuel is left, etc., simply by a quick glance at the dashboard.

Also, there are known measuring instruments in which the indicator member of the display device is directly driven by a sensor responsive to the quantity to be measured but usually movement of the indicator member is not directly related to this quantity. Therefore, very often the quantity is firstly transformed into an electric current whose magnitude is a function of the magnitude of the quantity and this current is supplied to a galvanometer driving the indicator member.

This arrangement has several drawbacks.

Firstly, the error of measurement is compounded with an inherent error of the galvanometer which may vary as a function of the magnitude of the measured quantity.

Secondly, galvanometers are often sensitive to shocks and vibrations.

Thirdly, measuring and control instruments frequently nowadays rely on digital techniques in which the magnitude of the quantity is represented by data composed of a sequence of logic states that can be displayed directly by a digital display device. This is the case now since sensors such as quartz temperature and pressure sensors are available that directly supply a digital signal representing the magnitude of the detected parameter. Therefore, if for the previously stated reasons, it is desired to use analog display devices for instruments of this type, it is necessary to resort to relatively expensive digital/analog convertors.

Fourthly, and lastly, it is not possible to turn the indicator hand of a galvanometer through as many rotations as may be desired. Now, for some instruments such as altimeters, it would be advantageous to have an indicator hand that could turn several times around the dial in the same direction as long as the quantity keeps increasing and which would precisely indicate the units and possibly the tenths, associated with a digital display device such as a drum device coupled to the drive system of the indicator hand to indicate the tens and the hundreds etc.

There is a known arrangement, see in particular U.S. Pat. No. 4 314 146, enabling these disadvantages to be removed by using a bidirectional stepping motor to drive the indicator member.

Unfortunately, the use of a stepping motor alone does not remove another drawback of some analog display devices, namely:

When producing a digital display device for measuring several quantities some of which are in different ranges of values, as is the case of a multimeter for example, as a general rule only one single electro-optical display device is used to indicate the results of all the measurements.

However, in the case of a multimeter with an analog display, it is necessary to provide several graduated scales on the dial which makes it more difficult to read the value of a measured quantity. This is all the more so when, as is generally the case, to avoid the apparatus becoming too bulky because of its dial, whenever possible some scales are arranged so that they each serve for reading the values of at least two measured quantities in different ranges. Thus, in a conventional multimeter one and the same scale graduated from 0 to 100 serves for reading voltage values comprised between 0 and 1 mV, 10 mV, 100 mV, 1 V, 10 V, 100 V and 1 KV as well as current strength values comprised between 0 and 1 $\mu$A, 10 $\mu$A, 100 $\mu$A, 1 mA, 10 mA, 100 mA and 1 A. As a result, if the selection button is placed in the position for which the scale corresponds to the range 0–10 mA, when the number 45 is indicated on the dial it has to be remembered that the measured current strength is not 45 mA but 4.5 mA.

Referring back once again to automobile vehicle dashboards, amongst the data that can at present be displayed analogically are, on the one hand, speed which must permanently be displayed and, on the other hand, parameters such as the number of revolutions per minute, the fuel level, the water and oil temperatures, the oil pressure and level, the battery voltage, etc., which do not have to be permanently displayed but could be made to appear at the driver's command, for example by pressing on a button, or when the value in question reaches a critical threshold.

In this manner, at any given moment or permanently, the driver could have available to him all the data he requires and no un-needed data. Moreover, he would have a reliable warning of any breakdown in the vehicle's operation or when there is an imminent shortage (of fuel, water, oil, etc.).

Also, vehicles are now being equipped with electronic control systems which include many sensors and a central microprocessor processing the data supplied by the sensors to automatically control the operation of various parts of the vehicle, some of the data being displayed by instruments on the dashboard.

Because of this, the amount data of different sorts that can usefully be brought to the driver's attention is much greater than has been the norm up to present.

Now, if for the reasons given at the outset it were attempted to display all data that can be analogically displayed using analog display devices, in order to keep the dashboard confined to reasonable dimensions it would be practically essential to divide the data into groups and to display each group with a single display device. But this would necessarily bring in, and considerably aggravate, the problem of the difficulty of reading the measured quantities discussed in connection with multimeters.

It would therefore become necessary for the driver or the microprocessor to be able to make several scales appear, one on top of one another on a single display device and for the indicator member thereof to indicate the corresponding value on each scale.

Finally, it would sometimes be advantageous to be able to modify the scale on which a quantity is indicated in order to be able, at given times, to cause the analog display devices to show marks or signals giving information to or warning the driver about his driving or the operation of the vehicle.

An object of the invention is precisely to provide a display device enabling all of this to be done separately or in combination, not only for vehicles but also for any other application in which the same features would be desirable.

This object is achieved firstly due to the fact that in a device according to the invention for displaying the value of at least one quantity, which device also comprises a mobile indicator member driven by a stepping motor, a first control circuit that responds at least indirectly to an input data representative of the quantity in question by delivering to the motor drive pulses to bring the indicator member to a position which corresponds to the value of the quantity, and means for displaying an indexing system that cooperates with the indicator member to indicate at least in which range this value is situated, these means comprise an electro-optical display cell for displaying the indexing device in response to control signals, and the fact that this display device also comprises a second control circuit for delivering these control signals to the cell in response to an activation signal.

The term "electro-optical display device" is used to designate a cell having at least two insulating plates between which is enclosed a layer of material responsive to an electric field applied by means of electrodes carried by these plates to produce a modification of its optical properties.

It may for example be a liquid crystal cell capable of displaying the indexing system dark on a light background or light on a dark background. As will be seen later, each of these manners of displaying the indexing system has its advantages and one may be chosen in preference over the other as a function of the intended application of the display device.

Furthermore, when useful or necessary the cell can be designed for the display of at least two indexing systems and the second circuit can additionally receive a selection signal so that different control signals can be supplied to the cell to cause it to selectively display one index system or the other.

In this case, the two indexing systems may correspond to different ranges of values of the same quantity and the device may additionally comprise means which also receive the selection signal and process the input data before sending it to the first control circuit, whereby the number of drive pulses supplied to the motor is adapted to the indexing system displayed by the cell.

Another possibility is that the two indexing systems are designed to indicate the values of different quantities, these quantities being represented by respective input data received by the display device and the latter also comprising means for receiving the selection signal and for selecting the input data corresponding to the indexing system displayed by the cell and supplying it to the first control circuit.

In either case, the cell is preferably designed to be able to display the two indexing systems, which may for example be two graduated scales, alternately in the same place.

Further characteristics and advantages of the invention will appear from the following description with reference to the accompanying drawings in which:

FIG. 1 schematically shows a voltmeter provided with a display device according to the invention for the indication of voltage values on two different scales;

Figure 1:
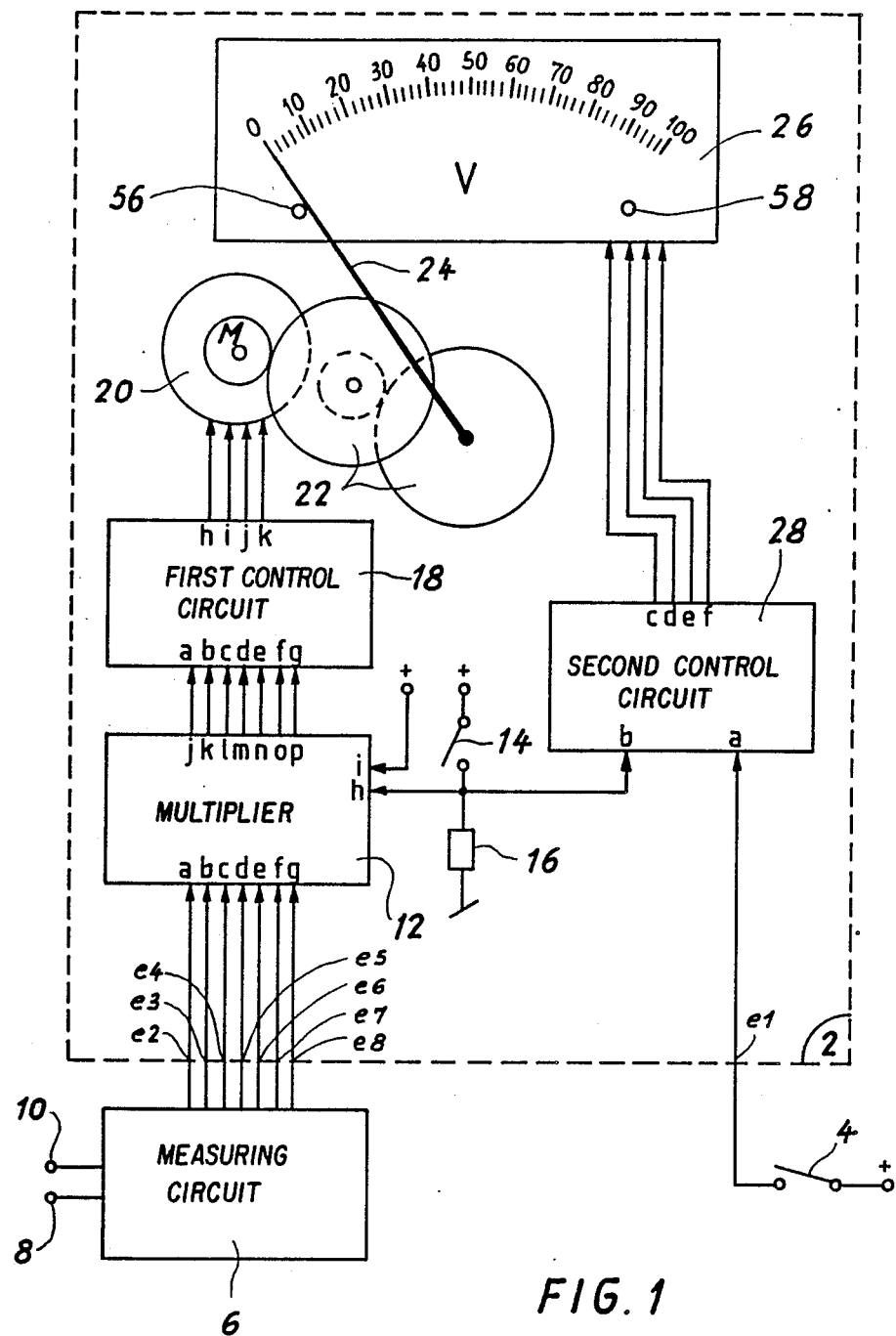

The voltmeter schematically shown in FIG. 1 is designed to measure voltages between 0 and 100 V.

Its display device 2 is arranged to enable reading of a voltage value on two scales graduated from 0 to 100 V and 0 to 30 V.

This device has a first input e1 connected to an on-off switch 4 by which a voltage can be applied to the circuits of the voltmeter by connecting them to a d.c power supply not shown.

As will be seen later, in this instance the signal produced by closing the switch 4 constitutes the aforementioned activation signal.

The device 2 also has seven further inputs e2 to e8 through which it can receive data composed of seven bits supplied by a measuring circuit 6 when the voltmeter is switched on and a voltage to be measured is applied across its input terminals 8 and 10, this data of course being representative of the magnitude of said voltage.

The seven inputs e2 to e8 are connected to seven corresponding inputs a to g of a two-bit multiplier circuit 12 which also includes two further inputs h and i for setting its multiplication factor and seven outputs j to p.

The input h is connected to the common terminal of a switch 14 whose other terminal is connected to the positive terminal of the power supply of the voltmeter, and a resistor 16 whose other terminal is connected to ground.

The other input i is connected directly to the positive terminal of the power supply.

Hence, when the switch 14 is open the inputs h and i are respectively in the "0" and "1" logic states which corresponds to the binary number 01. In this case, the multiplier circuit therefore simply transmits the data it receives on its inputs a to g to its outputs j to p.

If, to the contrary, the switch 14 is closed the inputs h and i are both in the "1" state which corresponds to the binary number 11, and the input data is therefore multiplied by 3.

In fact, what controls the multiplication of the circuit's input signal by a factor of 1 or 3 is the logic selection signal produced by the switch 14 because the logic state of the input i does not change.

The seven outputs of the multiplier circuit 12 are connected in turn to seven corresponding inputs a to g of the control circuit 18 of a bidirectional stepping motor 20 which is coupled to an indicator hand 24 via a gear train 22 whereby the hand can be pivoted in both directions about an axis by a limited amount, as will be specified later.

The display device 2 has a dial 26 constituted wholly in this instance by a liquid crystal display cell, which enables the two scales graduated from 0 to 100 V and 0 to 30V to be shown selectively at the same location. The device also includes a control circuit 28 for this cell with two inputs a and b respectively connected to the input e1 of the device and to the common terminal of switch 14 and resistor 16, and four outputs c to f.

The motor 20 may for example be made according to U.S. Pat. No. 4 361 790. This motor comprises a rotor made up of a diametrally-magnetized bipolar magnet, a stator having three pole-parts surrounding the rotor and two windings adapted to be supplied with bipolar drive pulses to rotatably drive the rotor in either direction by steps of 180°. Generally, the two coils of such a motor are supplied simultaneously which means that they must be diagonally connected in a bridge made up of four power transistors. This explains why there are four conductors connecting the motor 20 to four outputs j to k of the control circuit 18 in FIG. 1.

The control circuit 18 will not be described in detail here because, with the multiplier circuit 12, switch 14 and resistor 16, it can be the same circuit as that described in the aforementioned U.S. Pat. No. 4 314 146.

The only detail that is not mentioned in said patent is the construction of the circuit for generating drive pulses in response to periodic pulses produced by an adjustable pulse generator and to a signal controlling the direction of rotation of the motor. There are already known circuits of this type for controlling motors, in particular for watches, for instance the circuit described in U.S. Pat. No. 4 361 790.

The cell 26 can theoretically be of any known type. However, for a voltmeter like the one being described it is preferable to use a cell operating by reflection, as for example one of the cells shown schematically in cross-section in FIGS. 2a and 2b.

For other applications, for example a vehicle speedometer, a cell which operates by reflection for daytime reading and by transmission for reading at night may in some instances be chosen.

Figure 2A:
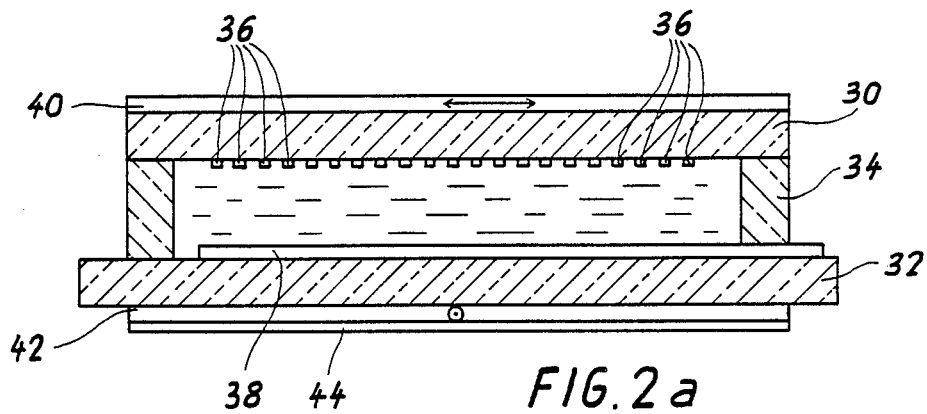
FIGS. 2a and 2b are schematic cross-sectional views of two liquid crystal display cells that can be used in the voltmeter of FIG. 1.

The cell shown in FIG. 2a is a positive contrast cell, i.e. a cell which displays the scales dark on a light background and which, of course, is associated with a black or dark-colored indicator hand 24.

This cell of FIG. 2a comprises a transparent front plate 30 and a transparent rear plate 32 connected together by a frame 34 in a manner to form a fluid-tight enclosure enclosing a layer of a nematic liquid crystal having positive dielectric anisotropy.

The front plate 30 carries on its inner face a set of transparent electrodes 36, for example of indium oxide or tin oxide, arranged in a configuration corresponding to the scales, and an alignmnent layer, not shown, for orienting the molecules of the liquid crystal or of the mixture adjacent thereto in a direction parallel to the plates and to the plane of the Figure in the absence of an electric field.

On the inner face of the rear plate 32 is located a transparent counter-electrode 38 covering the plate 32 at least over the entire display zone, and an alignment layer (also not shown) for orienting the molecules of the liquid crystal close to plate 32 in a direction which once again is parallel to the plates but in this instance perpendicular to the plane of the Figure.

The cell of FIG. 2a also comprises a first polariser 40 fixed to the outer surface of the front plate 30 and having a direction of polarisation parallel to the plates and to the plane of the Figure, a second polariser 42 fixed on the outer surface of the plate 32 and having a direction of polarisation perpendicular to that of the first polariser, and a reflector-diffuser 44 fixed on the rear surface of the second polariser.

The operation of such a cell—generally known as a twist nematic cell—is well known and therefore need not be described in detail here.

It is also known that to convert a cell of this type into a negative contrast cell displaying light scales on a dark background, it suffices to replace one of the polarisers 40, 42 by a polariser having its direction of polarisation parallel to that of the other polariser.

Figure 2B:
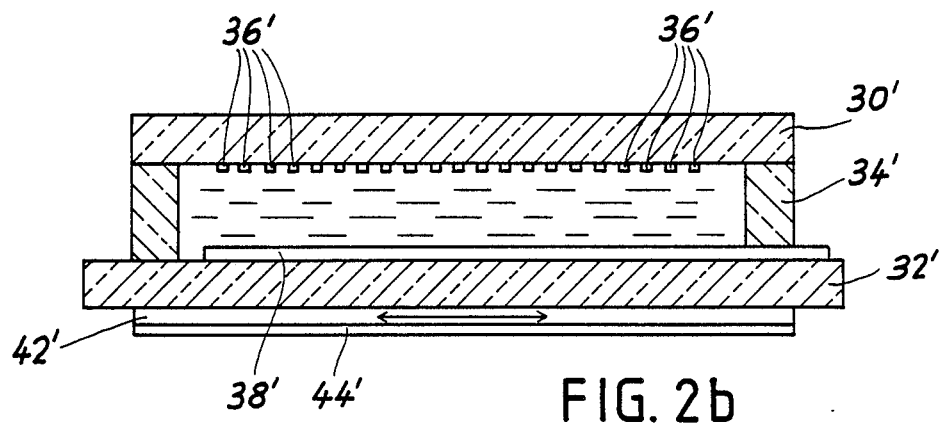

The cell of FIG. 2b is another type of cell which also enables light scales to be displayed on a dark background.

It comprises a front plate 30', a rear plate 32', a frame 34', a set of electrodes 36' and a counter-electrode 38' identical to those of FIG. 2a and arranged in the same way. It also has a reflector-diffuser 44' situated behind the plate 32'.

It is distinguished from the cell of FIG. 2a in that:

(1) it has only a single polarise 42' which as shown in the drawing is placed between the rear plate 32' and the reflector-diffuser 44', but could equally be on the front plate 30';

(2) the enclosure formed by the plates 30', 32' and frame 34' contains, in addition to a liquid crystal with positive dielectric anisotropy, a mixture of such a crystal with a pleochroic colorant having a high coefficient of absorbtion for most visible wavelengths, for example the colorant described in W. German Pat. No. 3028593; and (3) the planar alignment layers (not shown) provided on the inner surfaces of the plates 30', 32' are arranged so that when no electric field is applied the molecules of the liquid crystals and the pleochroic colorant are all oriented in the same direction parallel to the plates and to the direction of polarisation of the polariser 42'.

This cell, usually called a HEILMEIER cell after the name of its inventor, is also well known and without it being necessary to explain its operation we can state that the presence of the pleochroic colorant enables the scales to be displayed on a practically black background so that if, as must be the case, a white indictor hand or a light colored and preferably brilliant indicator hand is chosen, it will stand out very well against this background. Of course, if desired, instead of the indicated one, it would alternatively be possible to use a pleochroic colorant that absorbs only a part of the visible wavelengths so as to produce a dark colored background instead of a black one.

Two further examples of known cells operating by reflection and which could replace the cells of FIGS. 2a and 2b can also be mentioned.

The first example is the cell described in U.S. Pat. No. 3 833 287. This cell uses a mixture of nematic liquid crystal with positive dielectric anisotropy, pleochroic colorant and cholesteric liquid crystal or a chiralic agent as well as planar alignment layers. This is a negative contrast cell and does not require a polariser.

The second example is a cell like that described in U.S. Pat. No. 4 281 903. This cell comprises a mixture of nematic liquid crystal with negative dielectric anisotropy, chiralic agent and a pleochroic colorant, and has hemotropic alignmemt layers on its plates for orientating the molecules of the mixture perpendicular to the plates when no electric field is applied. This cell also operates without a polariser, but has positive contrast.

Generally speaking, a cell that displays signs as dark on a light background has a better contrast and greater luminance than a cell that displays the same signs light on a dark background.

However, if two similar display systems are provided, one having a dark indicator hand placed in front of a dial composed of a cell for displaying a scale with positive contrast and the other with a light indicator hand placed in front of a dial composed of a cell for displaying the same scale with negative contrast, and the two are compared, the second system has an aesthetically much more pleasing appearance than the first due mainly to the fact that the indicator hand appears to be closer to the dial.

In point of fact, the surface of a cell forming the background on which the scale can be displayed is the surface the furthest away from the indicator hand that reflects light able to reach an observer's eye.

In a twist nematic cell of the type in FIG. 2a or a cell of the type described in U.S. Pat. No. 3 833 287 said surface is situated level with the front surface of the reflector-diffuser at the rear of the cell.

To the contrary, in a twist nematic cell with negative contrast like the one referred to, said surface is level with the polariser situated on the front plate, and in a HEILMEIER cell or the cell described in U.S. Pat. No. 4 281 903 it is situated practically level with the inside surface of their front plates. In all these cases therefore, said surface is situated much closer to the indicator hand.

Moreover, with such cells displaying light on a dark background, the shadow of the indicator hand on the dial may be very dim or even eliminated when the background is truly black.

Consequently, for a voltmeter like that of FIG. 1, a choice can be made between a positive contrast cell or a negative contrast cell as a function of the perceived importance of the respective advantages, possibly with a preference for the former as it facilitates reading of the values of the measured voltages.

Display devices for a vehicle's dashboard should have an aesthetic appearance and should not be very luminous so as not to distract the driver, especially at night, and therefore preference may be given to a negative contrast cell.

Figures 3A, 3B, 3C:
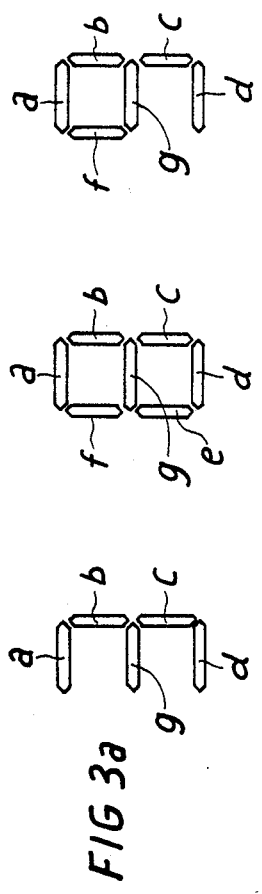
FIGS. 3a, 3b and 3c show, on an enlarged scale, the configuration of three digits by means of which different numbers can be displayed on the two scales.
Figure 3:
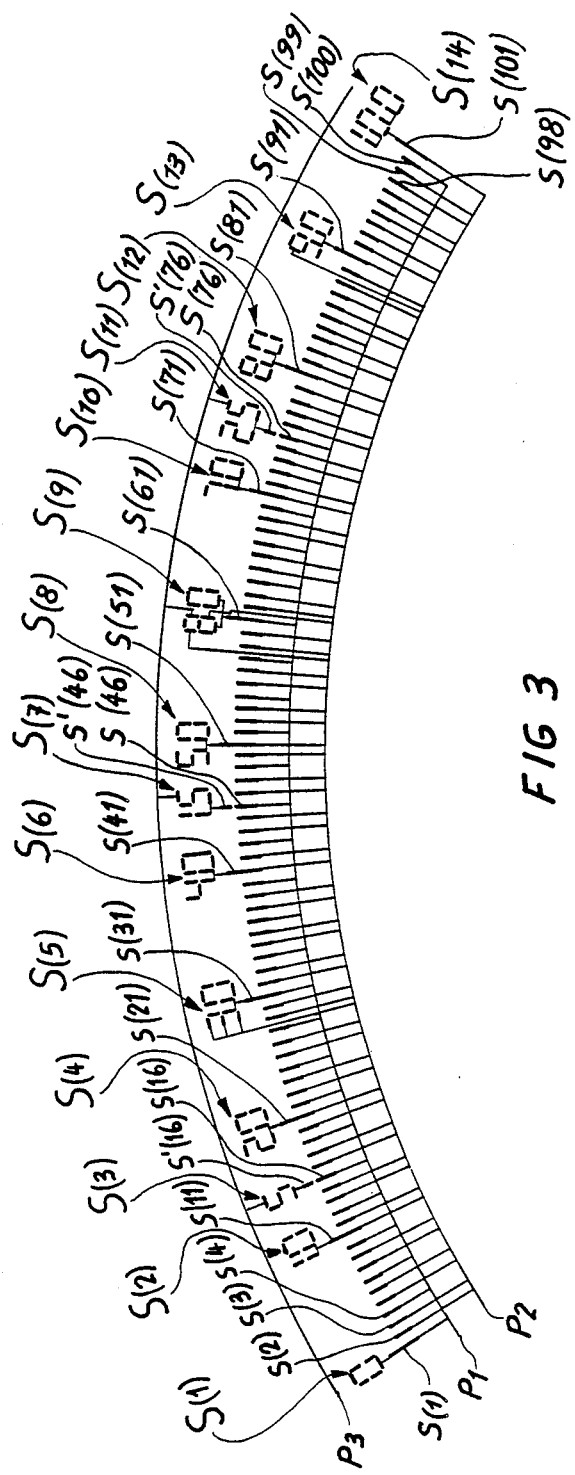
FIG. 3 shows a possible configuration for the electrodes of the cells of FIGS. 2a and 2b to enable the selective display of the two cells in question at the same location.

FIG. 3 shows how the set of electrodes 36 of the cell of FIG. 2a or the electrodes 36' of the cell of FIG. 2b may be arranged for the selective display of a first scale graduated from 0 to 100 or a second scale graduated from 0 to 30.

This set comprises 101 segments s(1) to s(101) arranged in an arc radially and equidistant from one another to show the graduations of the two scales, fourteen groups of segments S(1) to S(14) for displaying, above the corresponding graduations, the index numbers 0, 10, 20, 30, 40, 50, 60, 70, 80, 90 and 100 for the scale 0 to 100 and the index numbers 0, 5, 10, 20, 25 and 30 for the scale 0 to 30 (which, as we will see later in fact extends slightly further), and three segments s'(16), s'(46) and s'(76) for extending the segments s(16), s(46) and s(76) for the 0 to 30 scale.

As for the scale of a conventional dial, the segments s(1), s(11), s(21), . . . , s(91) and s(101) which correspond to the graduations 0, 10, 20, 100 are longer than the others. However, the graduations displayed by segments s(1), s(31), s(61) and s(91) are common to the two scales. It is therefore desirable, for the sake of uniformity and to facilitate reading, that the graduations corresponding to 5, 15 and 25 V on the scale from 0 to 30 should have the same length as those corresponding to 0, 10, 20 and 30 V.

It can also be seen from FIG. 3 that all of the segments for the graduations and the index numbers are connected by only three conductive paths P1, P2 and P3.

All of the radial segments s(1), s(4), s(7), . . . , s(97), s(100), or, expressed in another way, all of the segments s(3n+1), where n≧0, i.e. the segments which serve for displaying the graduations common to the two scales, are connected by the path P1.

All of the segments s(3n+2) and s(3n+3) that serve only to display graduations of the scale 0–100 are connected by the path P2.

The six segments of group S(1) which form the number 0 are connected together and to the path P1.

The eight segments of group S(2) which form the number 10 are connected together and to the path P2. The same applies to the segments of groups S(4), S(6), S(8), S(10), S(12) and S(14) which form the numbers 20, 40, 50, 70, 80 and 100.

The five segments of group S(3) which form the number 5 and the extension segment s'(16) are connected together and to the path P3 and the same applies to the segments of group S(7) which form the number 15 and segment s'(46) and to those of the group S(11) which form the number 25 and the segment s'(76).

The segments of groups S(5), S(9) and S(13) serve for the display of different index numbers for the two scales.

The group S(5) comprises a first digit with two vertical segments b and c and three horizontal segments a, d and g (see FIG. 3a) for displaying the number 1 or the number 3 and a second digit of six segments to display the number 0. The two vertical segments of the first digit and the six segments of the second digit are connected together and to the path P1, via the segment s(31), whereas the three horizontal segments of the first digit are connected to the path P2.

The group S(9) comprises a first digit with seven segments a to g, of conventional type (see FIG. 3b) for displaying the numbers 2 and 6 and a second digit of six segments for the number 0.

The segments a, d, e and g of the first digit and all segments of the second digit are connected together and to the path P1 whereas the segments c and f of the first digit are connected to the path P2 and its segment b is connected to the path P3.

The group S(13) comprises a first digit of six segments a, b, c, d, f, g (see FIG. 3c) for displaying the numbers 3 and 9 and a second digit of six segments for the number 0. Here, the segments a, b, c, d and g of the first digit and all segments of the second digit are connected together and to the path P1 whereas the segment f of the first digit is connected to path P2.

Figure 4A:
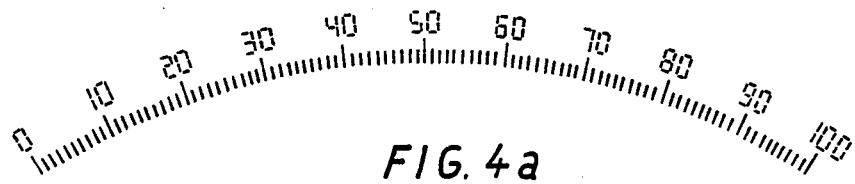
FIGS. 4a and 4b show these two scales.

Therefore, when a voltage is applied between the counter-electrode 38 or 38' of the cell (see FIGS. 2a and 2b) and the paths P1 and P2, the scale from 0 to 100 is displayed as shown in FIG. 4a.

Figure 4B:
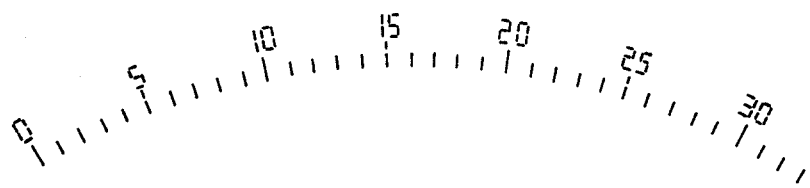

If however a voltage is applied between the counter-electrode and the paths P1 and P3 the cell displays the scale from 0 to 30 (or more precisely 0 to 33) as shown in FIG. 4b.

Figure 5:
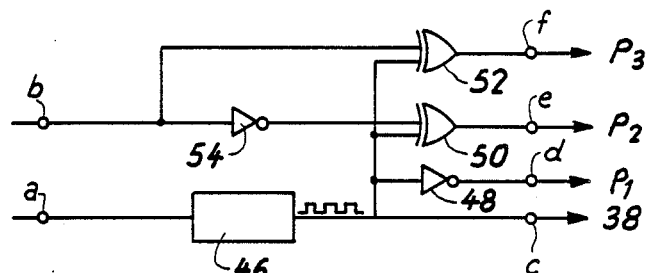
FIG. 5 shows how the cell's control circuit can be arranged when the electrodes are configured as shown in FIG. 3.

Before describing an embodiment of the control circuit shown in FIG. 5 for application of the voltages between the counter-electrode and the paths, it is useful to elaborate on two points.

The first is that the electrode configuration of FIG. 3 is not restricted only to cells of the type shown in FIGS. 2a and 2b. It may also be suitable for other types of cell in particular those that have been identified but not described in detail.

The second point is that the graduations of the scale 0–30 are made up of one graduation out of three on the scale 0–100. This is not simply because the electrode configuration is simpler than if, for example, the 30 graduation of one scale were made to correspond to the 100 graduation of the other. For the voltmeter of FIG. 1, the given configuration is a necessity dictated by the construction of the chosen control circuit for which the ratio between the two scales must be equal to the multiplication ratio of the circuit 12.

The cell's control circuit shown in FIG. 5 comprises an oscillator 46 connected to the power-supply input a (see FIG. 1). When supplied, this oscillator produces periodic pulses of frequency between 30 and 60 Hz, for example 50 Hz, and supplies these pulses directly to the output c of the circuit which is connected to the counter-electrode 38 or 38' of the cell (see FIGS. 2a and 2b). These pulses are also sent to the input of an inverter 48 and to the first inputs of two EXCLUSIVE OR gates 50 and 52 whose outputs are respectively connected to the outputs d, e and f of the circuit which are themselves connected to the paths P1, P2 and P3 of the cell (see FIG. 3).

The input b of the circuit is connected directly to a second input of the gate 52 and via an inverter 54 to a second input of gate 50.

Thus, when the switch 4 is closed to switch the voltmeter on, the logic state of the input a passes from "0" to "1" and two signals of opposite phase are produced at the outputs c and d. This leads to the production of a potential difference between the cell's counter-electrode and the segments connected to path P1. The value of this potential difference is equal to twice the amplitude of the signal produced by the oscillator. Therefore, all of the graduations and the parts of the index numbers common to the two scales as well as the number 0 are displayed.

If, additionally, the input b has the logic state "0", the signal at the output f and delivered to path P3 is in phase with the signal at output c. As a result, the potential difference between the segments connected to this path and the counter-electrode is zero. Therefore, all of the components needed to complete the common graduations and parts of the index numbers to form the scale 0 to 30 remain invisible.

However, all of the complementary graduations and numbers or parts of numbers for forming the scale 0 to 100 appear, because the signal delivered from the gate 50 to path P2 is also in phase opposition to the signal of the oscillator.

Of course, when the input b has the logic state "1" the opposite happens.

Referring back again to FIG. 1, the front plate of cell 26 has two abutments 56 and 58 for limiting the swing of the indicator hand 24. The position of the first abutment, 56, is important because it must make the indicator hand stop exactly facing the 0 graduation of the two scales. The position of the other abutment 58 is less critical. It merely needs to allow the indicator hand to reach the 100 graduation and it is not harmful if the indicator hand goes a little further.

It follows from the above explanation that when the voltmeter is switched on while the switch 14 is open, the cell 26 instantaneously displays the scale 0 to 100.

If a voltage of, for example, 67 V is then applied to the input terminals 8 and 10, the measuring circuit supplies the binary data 1000011 to the multiplier circuit 12 which simply transmits this to the control circuit 18 which then converts this data into the number of drive pulses needed to turn the motor 20 forward by 67 steps to bring the indicator hand 24 to face the graduation 67 of the dial.

Suppose now that the applied voltage drops from 67 V to 52 V.

The binary data received by the control circuit 18 from the measuring circuit through the multiplier circuit becomes 0110100 and the circuit 18 therefore controls the motor 20 to make it move back through 15 steps so that the indicator hand swings to face the 52 graduation of the scale.

Suppose lastly that the switch 14 is closed after the voltage in question is no longer applied to the terminals 8 and 10 and the indicator hand has moved back to 0. The cell immediately displays the scale 0 to 30 instead of 0 to 100.

If another voltage, for example 21 V, is applied to the voltmeter, the circuit 12 multiplies the binary data 0010101 from the measuring circuit by a factor of three. Therefore, the control circuit 18 receives the data 0111111 and causes the motor to move forward through 63 steps so that the indicator hand comes to be placed facing the 21 graduation of the scale.

Had the applied voltage been greater than that required to make the indicator hand abut against the abutment 58 but less than 100 V, it would have been possible to re-open the switch 14 whereby the value of the voltage could be read on the scale 0 to 100.

The switch 14 could, in a variation, be replaced by a comparator which compares the output data from the measuring circuit with the binary number corresponding to 30 and produces an output signal enabling automatic selection of the multiplication factor of the circuit 12 and of the displayed scale as a function of the value of the measured voltage.

In another variation, instead of being produced by an on-off switch 4, the activation signal could be produced by the measuring circuit or by other means, at the moment when the applied voltage is applied to the terminals 8 and 10 of the voltmeter.

Furthermore, it is clear that within the field of measuring electrical quantities, other examples of the invention can be envisaged.

Specifically, a voltmeter capable of displaying voltages on scales 0 to 1, 10 and 100 could be envisaged.

In such a voltmeter, the multiplication circuit would be eliminated and the selection switch 14 replaced by a three-way switch for applying the selection signals to the measuring circuit so that the latter supplies the same binary data for the same number of hundredths of a volt, tenths of a volt and volts. The cell and its control circuit which would also receive the selection signals would be arranged so that the same graduations are always associated with different sets of index numbers, for example 0, 0.1, 0.2, . . . , 1.0 for the scale 0 to 1 V; 0, 1.0, 2.0, . . . , 10 for the scale 0 to 10 V and 0, 10, 20, . . . , 100 for the scale 0 to 100 V.

It is also possible to envisage a display device for indicating voltage values on a linear scale graduated, for example, from 0 to 100 V as well as resistance values on a non-linear scale graduated from 0 to 1000 ohm. A device of this type could have two groups of inputs for receiving data representing the two quantities and a switch-controlled or an automatic selector for selecting the appropriate data and delivering it to the motor's control circuit which obviously would be different from that of the display device of FIG. 1. Moreover, in this instance there would no longer be a simple correspondence between the two scales. Therefore, to avoid problems that may arise with an electrode configuration comparable to that of FIG. 3, instead a point matrix cell or two superimposed cells each of which can display one scale could be used.

Figure 6:
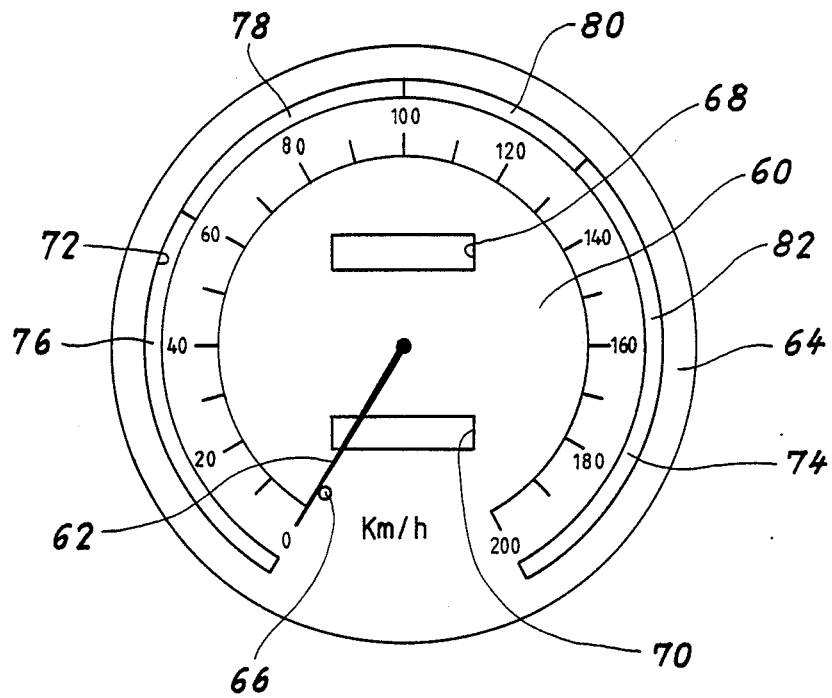
FIG. 6 is a front view of an automobile speedometer according to the invention.

FIG. 6 partially shows another example of a display device according to the invention, which is quite different from those previously described. It is an automobile speedometer that can be illuminated at night from in front. FIG. 6 shows only its dial 60 and indicator hand 62 that can be made to turn by a stepping motor and a gear-train located behind the dial.

The dial 60 comprises a circular, opaque plate 64 having a central hole for the indicator hand's pivot. On the dial 60 is shown an arcuate scale graduated from 0 to 200.

As shown in FIG. 6, this plate 64 has on its front face an abutment 66 for setting the extreme position of the indicator hand 62 against the 0 of the scale.

The dial also comprises, in addition to the two usual windows 68 and 70 for viewing the kilometer or mileage totaliser and the resettable daily counter, another window 72 which is arcuate and entirely surrounds the scale and behind which is a liquid crystal display cell 74.

The cell 74 is designed to display zones of different colors the boundaries of which correspond to statutory speed limits.

Taking the example of a passenger car for France, there could be a first zone 76 colored blue extending from 0 to 60, a second zone 78 colored green extending from 60 to 100, a third zone colored red extending from 130 to 200, these fourth zone colored red extending from 130 to 200, these figures corresponding to the present day speed limits for driving in town, on the open road and on motorways, namely 60, 100 and 130 Km/h.

These zones can be displayed in two ways.

The first is to successively activate the zones as the speed of the car increases, without disactivating the previous zone(s).

The second is to activate only that zone corresponding to the speed of the car.

Hence, in both instances, and perhaps even better in the second, the driver can easily see if speed limitations are being respected.

Of course, for aesthetic reasons and in order to make the activated zones as visible as possible, the color of the non-activated zones should correspond as closely as possible to the color of the front face of the plate 64.

We will now describe, by way of example, a cell that can be employed when the front surface of the plate is black or dark grey, which is often the case.

Figure 7:
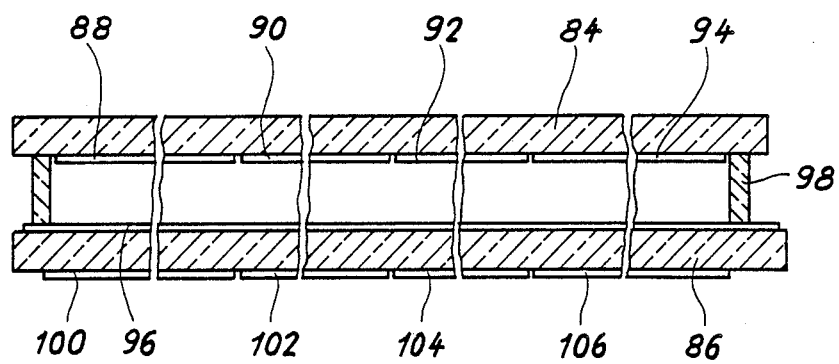
FIG. 7 is a schematic cross-sectional view of a liquid crystal display device that may be incorporated in the speedometer of FIG. 6.

This cell, shown in cross-section in FIG. 7, comprises a front plate 84 and a rear plate 86 both of glass and which carry on their respective facing faces, four adjacent electrodes 88, 90, 92 and 94 which correspond to the four zones to be displayed, on plate 84, and a single counter-electrode 96, on plate 86.

The two plates 84, 86, whose facing faces are also covered with planar alignment layers, not shown, are connected together by a frame of sintered glass 98 to form a fluid-tight enclosure.

This enclosure contains a liquid crystal having positive dielectric anisotropy mixed with a chiralic compound and a pleochroic colorant selected to make the non-activated zones have the desired black or dark grey appearance.

The cell of FIG. 7 also comprises four diffuser reflectors 100, 102, 104 and 106 of different colors, fixed to the outer surface of the rear plate 86 and located exactly opposite the four electrodes.

When no electric field is applied between the electrodes and the counter-electrode of the cell the molecules of the mixture are parallel to the plates and have a helical stucture of small pitch, which means that practically all of the incident light is absorbed by the molecules of pleochroic colorant and the zones therefore assume the desired black or dark grey appearance.

When, however, an electric field is applied between any one electrode and the counter electrode the mixture in this region changes to a homeotropic structure, i.e. its molecules are aligned perpendicular to the plates whereby incident light is no longer absorbed but is reflected and shows the color of the reflector-diffuser aligned with the electrode in question.

The electronic part of a speedometer like that of FIG. 6 may for example comprise: a circuit for shaping the signal produced by an inductive sensor that detects the rotational speed of the gear-box output shaft and converts this signal into binary data composed of several bits; a control circuit for the motor based on that of U.S. Pat. No. 4 314 146, to which the binary data is delivered; three comparators to which said data is also delivered; and a circuit for controlling the cell, connected to the outputs of these three comparators and to which a starting signal is delivered when the car engine is started up.

Once again, the circuit for controlling the cell can be very simple. In the first mentioned possibility where the previously-actuated speed zones remain displayed, it may simply comprise an oscillator, an inverter and three EXCLUSIVE OR gates.

The invention as claimed is of course not limited to the above described or envisaged embodiments.

For example, it would be possible to conceive a device with a cell that simultaneously displays two scales superimposed on one another, or one in extension of the other, and in which the motor would be controlled so that the indicator hand can indicate on these scales either values of a single quantity situated in different ranges or values of two distinct quantities. In this device, the circuit for controlling the cell would no longer receive a selection signal but a starting or activation signal.

Figure 8:
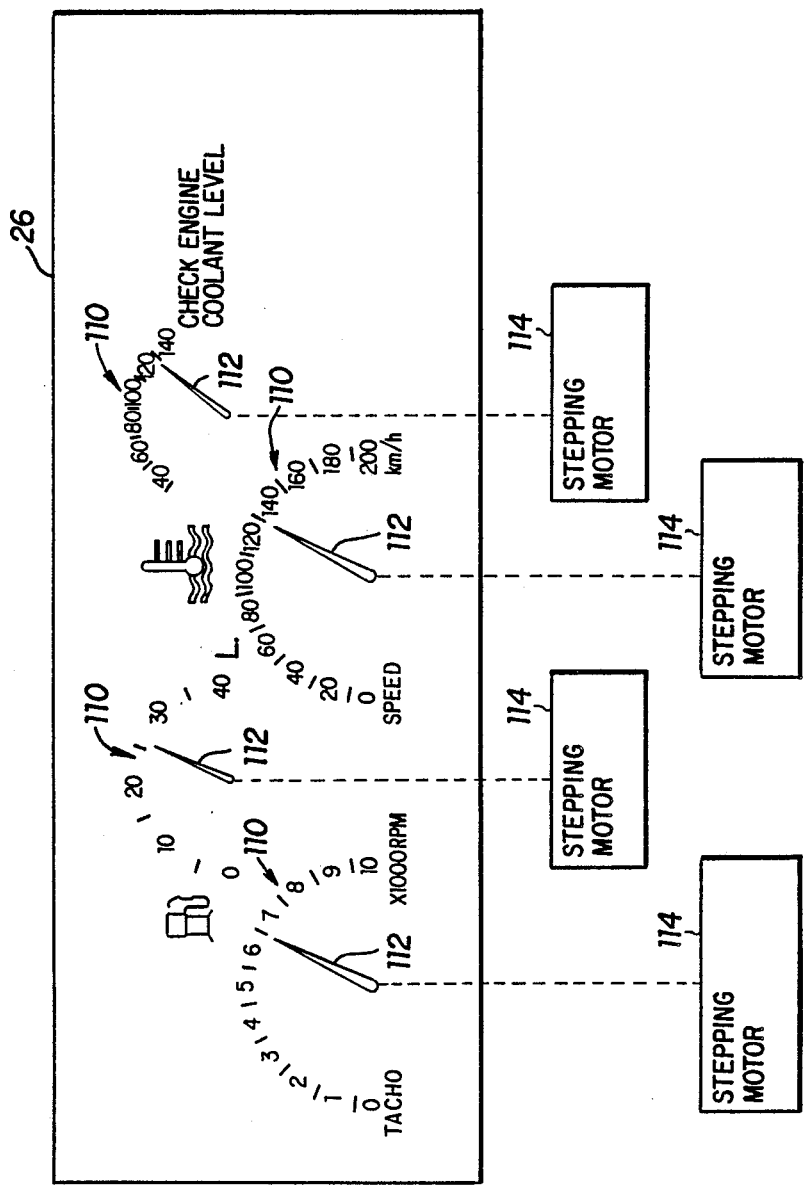
FIG. 8 illustrates a display cell having plural indexing systems positioned for display at different locations.

As illustrated in FIG. 8, t is also possible to envisage a device with a cell 26 that selectively or permanently displays several scales or, generally speaking, several index systems 110 at different locations and as many indicator members 112 each driven by a stepping motor 114 to indicate the values of the different quantities. Such a device would for example be suitable for a vehicle dashboard.

It is also possible to employ linear stepping motors for driving the indicator members, and cells employing electrochromic or electroluminescent substances as active component.

Finally, in some instances it is also possible for a device according to the invention to receive data representing the value of a quantity to be displayed in analog form, means being provided for converting the data to digital form.

We claim:

1. A device for displaying the values of at least two quantities, said device comprising:
    a dial including a single electro-optical display cell for displaying, at different locations in said display cell, at least two indexing system corresponding to said quantities;
    at least two mobile indicator members disposed at different locations,
    each indicator member being associated with one of said indexing systems and cooperating with its associated indexing system to indicate at least a range in which the value of one of said quantities is situated; and,
    at least two stepper motors for driving said indicator members.

2. A display device for displaying on a dial the value of at least one quantity represented by input data, comprising:
    a mobile indicator member driven by a stepping motor;
    a first control circuit responsive at least indirectly to said input data for providing drive pulses to the stepping motor to bring the indicator member to a position corresponding to the value of said the quantity represented by said input data;
    means for presenting a plurality of indexing systems which cooperate with said indicator member to indicate at least a range in which the value of said quantity is situated;
    said means for presenting said indexing system comprising a single electro-optical display cell for displaying at least two indexing systems;
    a second control circuit for supplying control signals to said display cell in response to an activation signal; and,
    said second control circuit including means responsive to a selection signal for supplying different control signals to said display cell to cause it to selectively display one or another other of said indexing systems.

3. A display device according to claim 1, wherein said indexing system is a graduated scale.

4. A display device according to claim 2 wherein the two indexing systems are arranged to display the values of different quantities, said values being represented by respective input data delivered to the display device, the device further comprising means which also receive said selection signal and which select the input data corresponding to the indexing system displayed by the cell and send it to said first control circuit.

5. A display device according to claim 2, wherein the display cell is adapted to selectively display the two indexing systems one in the place of the other.

6. A display device according to claim 2 wherein the indexing systems are graduated scales.

7. A display device according to claim 2 and further comprising manually operable switching means for producing the selection signal.

8. A display device according to claim 2, wherein said display cell is a liquid crystal cell operating by reflection and which displays said indexing system dark against a light background.

9. A display device according to claim 2, wherein said display cell is a liquid crystal cell operating by reflection and which displays said indexing system light against a dark background.

10. A display device according to claim 2, wherein the display cell is adapted to display several adjacent zones of different appearance and which correspond to successive value ranges of said quantity, and said second control circuit also receives a selection signal to make the display cell display the zone in which said value of the quantity is situated at a given moment.

11. A display device according to claim 10 wherein said zones are displayed in different colors.

12. A display device according to claim 10 wherein said display cell is a liquid crystal cell.

13. A display device for displaying on a dial the value of at lest one quantity represented by input data, comprising:
    a mobile indicator member driven by a stepping motor;
    a first control circuit responsive at least indirectly to said input data for providing drive pulses to the stepping motor to bring the indicator member to a position corresponding to the value of said quantity;
    means for presenting an indexing system which cooperates with said indicator member to indicate at least in which range the value of said quantity is situated;
    said dial comprises an electro-optical display cell for displaying said indexing system in response to control signals;
    said device also comprising a second control circuit for supplying said control signals to said display cell in response to an activation signal;
    said display cell being arranged to display at least two indexing systems and, said second control circuit including means responsive to a selection signal for supplying different control signals to said display cell to cause it to selectively display one or another of said indexing systems, the two indexing systems corresponding to ranges of different values of said quantity, said display device further comprising means responsive to said selection signal for processing said input data before sending it to said first control circuit whereby the number of pulses supplied to the motor is adapted to the indexing system displayed by the cell.

* * * * *